United States Patent [19]
Russell et al.

[11] Patent Number: 5,198,786
[45] Date of Patent: Mar. 30, 1993

[54] WAVEGUIDE TRANSITION CIRCUIT

[75] Inventors: Mark E. Russell, Londonderry, N.H.; Dominic V. Restagno, Waltham, Mass.

[73] Assignee: Raytheon Company, Lexington, Mass.

[21] Appl. No.: 803,317

[22] Filed: Dec. 4, 1991

[51] Int. Cl.$^5$ ............................................. H01P 5/107
[52] U.S. Cl. ..................................... 333/26; 333/219; 333/246
[58] Field of Search ............. 333/26, 33, 206, 243–245

[56] References Cited
U.S. PATENT DOCUMENTS

| | | | |
|---|---|---|---|
| 2,548,881 | 4/1951 | Ferrill, Jr. ........................ | 333/244 X |
| 3,167,729 | 1/1965 | Hall .................................... | 333/206 |
| 3,942,138 | 3/1976 | Schaedla ........................... | 333/33 X |

Primary Examiner—Paul Gensler
Attorney, Agent, or Firm—Donald F. Mofford; Richard M. Sharkansky

[57] ABSTRACT

A transition circuit includes a conductive pin; a first dielectric member disposed about a first portion of the conductive pin; and a second dielectric member disposed about a second, different portion of the conductive pin and having a first surface disposed adjacent to a first surface of the first dielectric member. A conductive wall is disposed about and contiguous to a second surface of the first dielectric member and a second surface of the second dielectric member. A strip conductor is disposed on a third surface of said second dielectric member and coupled between said conductive pin and said conductive wall.

11 Claims, 5 Drawing Sheets

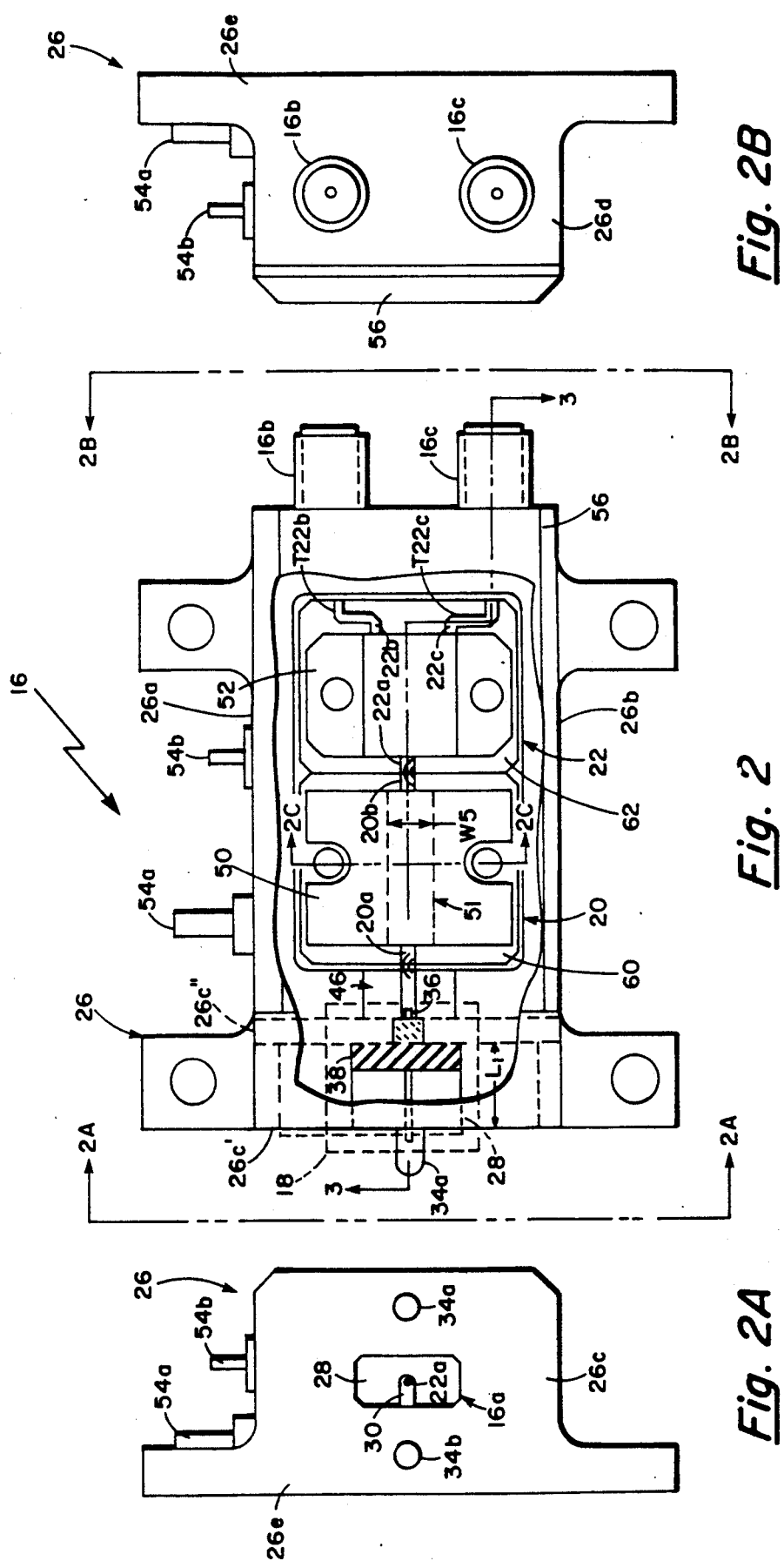

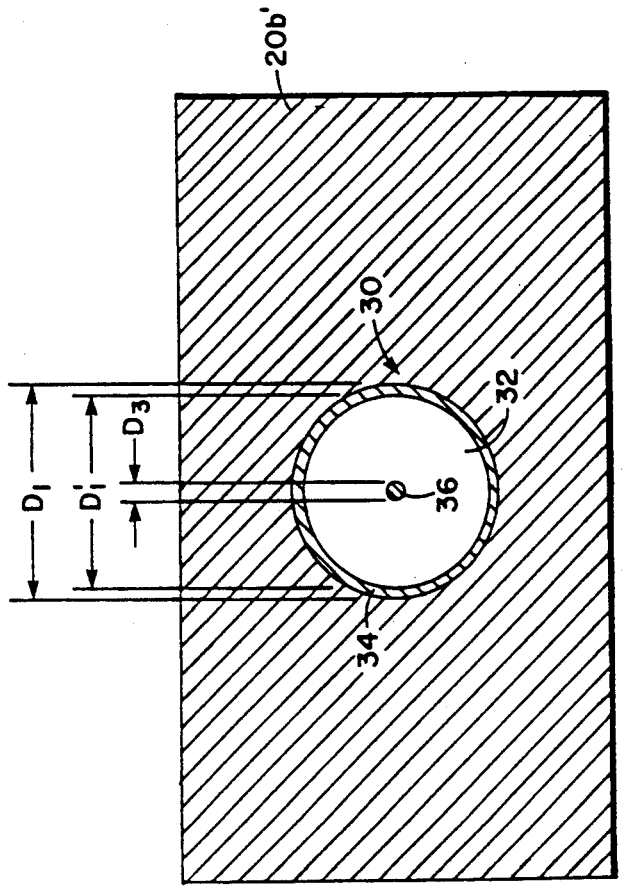
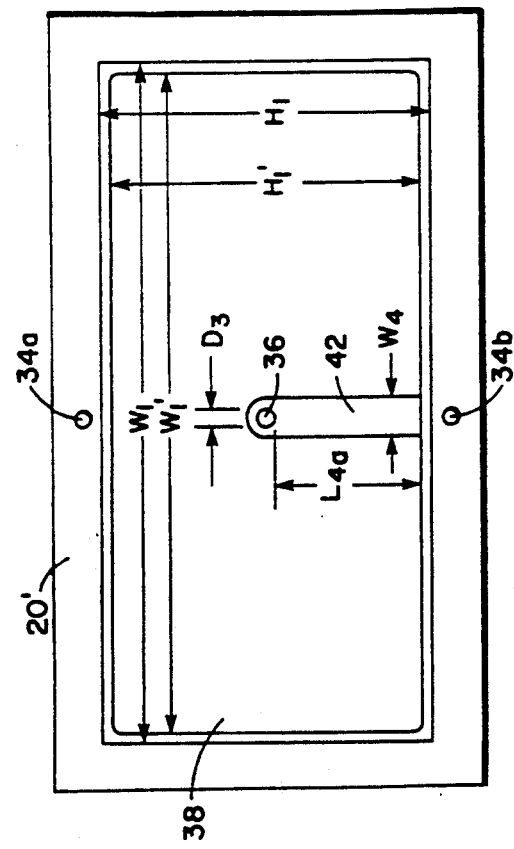

WAVEGUIDE TRANSITION CIRCUIT

BACKGROUND OF THE INVENTION

This invention relates generally to waveguide transmission lines and more particularly to waveguide transition circuits.

As is known in the art, a waveguide transmission line is a structure used to guide electromagnetic waves generally referred to as radio frequency (RF) signals. Waveguide transmission lines provide a transmission media having a relatively low insertion loss characteristic to RF signals fed thereto. Thus, waveguide transmission lines are used in those RF receiving and transmitting systems requiring RF transmission lines having a relatively low insertion loss characteristic.

As is also known in the art, a radar system is one particular type of RF system which detects RF signals. The radar system generally includes an antenna, a transmitter and a receiver. The radar transmitter emits an RF signal from the antenna. Portions of the transmitted RF signal are intercepted by reflecting objects (e.g. a target) and reflected back to the radar. The reflected RF signal is generally referred to as an echo signal. The antenna receives the echo signal and feeds the echo signal to the receiver.

Noise is unwanted RF energy which interferes with the ability of the receiver to detect the echo signal. The capability of the receiver to detect a weak echo signal is limited by the noise energy that occupies the same portion of the frequency spectrum as does the echo signal.

The echo signal and noise energy from external sources may both enter the radar receiver via the antenna. Noise energy may also originate in the receiver itself due to various causes such as thermal motion of the conduction electrons in ohmic portions of those circuit components which are disposed to provide the receiver.

The receiver cannot detect any echo signal having a power level below the power level of the noise energy. The weakest signal the receiver may detect is generally referred to as the minimum detectable signal. In the absence of a so-called jamming signal, the noise energy of external sources is generally relatively low. Thus the power level of the minimum detectable signal is limited by the noise of the radar receiver.

The effectiveness of the receiver to detect echo signals in the presence of noise energy may be represented by a figure of merit generally referred to as the noise figure of the receiver. In general, the noise figure of a radar receiver may be defined as the input signal to noise ratio divided by the output signal to the noise ratio. The input signal to noise ratio is provided by the ratio of the input signal power to the input noise power. Similarly, the output signal to noise ratio is provided by the ratio of the receiver output signal power to the output noise power. Thus, the noise figure may be interpreted as a degradation of the input signal to noise ratio as the echo signal passes through the receiver.

In the ideal case the receiver should not degrade the input signal to noise ratio. Therefore, in the ideal case, the noise figure of the receiver is unity (i.e. 0 decibels).

Every circuit component disposed between the antenna terminals and the intermediate frequency (IF) port of the receiver contributes to the noise figure of the receiver. A radar system having a so-called low noise receiver generally includes a low noise amplifier (LNA) and a mixer. The LNA is provided having a high gain characteristic and a noise figure close to unity. The contribution to the overall receiver noise figure from those components which follow the LNA is reduced by the gain characteristic of the LNA. Thus, to provide a receiver having a relatively low noise figure the LNA is generally provided as the first active component of the receiver.

The noise figure of a passive circuit component such as an RF transmission line for example, corresponds to the insertion loss characteristic of the component. RF transmission lines generally couple the antenna to the LNA. In a radar system provided with a low noise amplifier, the echo signal should ideally be coupled from the antenna to the LNA with no attenuation and therefore no increase in the noise figure of the receiver.

In practical radar systems, however, RF transmission lines which couple the antenna to the LNA may attenuate the echo signal and thus provide the receiver with an increased noise figure. Therefore, it is desirable to couple the echo signal from the antenna to the LNA with a minimum insertion loss characteristic.

The output ports of an RF antenna are often provided as waveguide transmission lines. The input and output ports of RF circuit components such as low noise amplifiers, mixers and the like, however, are generally provided as coaxial or strip conductor transmission lines. This is particularly true in those RF systems which operate in the microwave and millimeter wave frequency ranges. Thus, it is necessary to provide a transition between the waveguide transmission line of the antenna, for example, and the coaxial, or strip conductor transmission line of an RF circuit component such as an LNA for example.

Furthermore, a typical waveguide transmission line has a dominant mode wave impedance characteristic typically of about 377 ohms ($\Omega$). However, coaxial and strip conductor transmission lines are generally provided having an impedance characteristic typically of about 50 $\Omega$. Thus the transition means should provide both a physical transition and an electrical impedance transition between the waveguide transmission line and the coaxial or the strip conductor transmission line.

Moreover in radar systems having a low noise receiver, the transition should not degrade the noise figure of the low noise receiver. Thus, the transition should have a relatively low insertion loss characteristic.

A so-called waveguide transition circuit is used to transition from a waveguide transmission line to a coaxial or strip conductor transmission line. One type of waveguide transition circuit used to transition between waveguide and microstrip transmission lines is a so-called ridge-waveguide transition circuit. In the ridge-waveguide transition circuit, the waveguide is provided with a series of steps or ridges along the longitudinal axis of the waveguide transmission line. The lengths of the ridges are selected to correspond to an electrical pathlength typically of about one quarter wavelength at a predetermined frequency. Each successive ridge reduces the height of the waveguide transmission line.

A reduction in the height of a waveguide transmission line provides a change in the impedance characteristic of the waveguide transmission line. This change in impedance characteristic is similar to the change in impedance characteristic provided by a so-called quarter wave transformer circuit well known in the art and generally used in coaxial or strip conductor transmission lines. Thus, in the ridge waveguide transition circuit, the waveguide height is reduced until the impedance characteristic of the waveguide transmission line corresponds to the impedance characteristic of the microstrip transmission line.

Several problems exist with the ridge waveguide transition approach. First, because each ridge is one-quarter wavelength long, the resultant size of practical ridge waveguide transition circuits is relatively large. Second, at microwave and millimeter wave frequencies it is relatively difficult to provide the ridges in the waveguide with the required tolerances. Third, it is relatively difficult to provide a ridge waveguide transition circuit as a hermetically sealed circuit.

A second type of waveguide transition circuit is the so-called end launch transition circuit described in a paper titled "Coaxial-to-Waveguide Transition (End-Launcher Type)" by B. N. Das and G. S. Sanya published in the Proceedings of the IEE Vol. 123 No. 10 October 1976.

This paper describes a circuit which provides a transition between a coaxial transmission line and a waveguide transmission line. The outer conductor and dielectric portion of the coaxial transmission line are stripped away from the center conductor of the coaxial line. The center conductor of the coaxial line is then inserted into the waveguide. A conductive tab is connected between the center conductor of the coaxial line and an internal wall of the waveguide. The connection between the center conductor, the conductive tab and the internal wall of the waveguide provides a conductive loop which couples magnetic fields in the waveguide as is generally known. The coaxial electromagnetic mode is thus transformed to the dominant waveguide mode.

Several problems exist with this approach. First, the conductive tab which connects the center conductor of the coaxial line to the internal wall of the waveguide is soldered to both the coaxial line and the waveguide wall. At microwave and millimeter wave frequencies, the waveguide dimensions become relatively small and thus it becomes difficult to reliably provide such solder connections.

Second, this type of transition circuit is sensitive to variations in construction and assembly processes. Variations in the assembly process cause end launch transition circuits to have a relatively high insertion loss characteristic at the desired frequency of operation.

Third, this type of transition is not hermetically sealed. In many applications such as missile guidance radars, variations in environmental conditions such as temperature, humidity and altitude may result in condensed water being disposed in the waveguide. A waveguide having water disposed therein has an increased insertion loss characteristic, a degraded impedance characteristic and a reduced power handling capability. Thus, it is desirable to provide a waveguide transition circuit as a hermetically sealed waveguide transition circuit.

SUMMARY OF THE INVENTION

In accordance with the present invention, a radio frequency circuit includes a conductive pin, a first dielectric member disposed about a first portion of the conductive pin and a second dielectric member disposed about a second portion of the conductive pin and having a first surface contiguously disposed to a first surface of the first dielectric member. The radio frequency circuit further includes a conductive wall disposed about and contiguous to a second surface of the first dielectric member, and a second surface of the second dielectric member. The radio frequency circuit further includes a strip conductor disposed on a first surface of the second dielectric member and coupled between the conductive pin and the conductive wall. With such an arrangement, a transition circuit for coupling signals between a waveguide transmission line and a microstrip transmission line is provided. The second dielectric member, having the conductive strip disposed on a first surface thereof and coupled between the conductive pin and the conductive wall provides a conductive loop which couples electromagnetic signals between the waveguide transmission line and the microstrip transmission line. Further, providing the conductive strip on the second dielectric member simplifies the process used to fabricate the transition circuit and reduces the number of variations in the assembly process and thus minimizes variations in the electrical characteristics among several of such waveguide transition circuits. Moreover the first dielectric member disposed about the conductive pin provides the waveguide transition as a hermetically sealed waveguide transition circuit.

In accordance with a further aspect of the present invention, a radio frequency circuit includes an electrically conductive base having a first end and a second end with portions of the first end removed to provide a first port of the radio frequency circuit as a waveguide transmission line and a pair of coaxial connectors being disposed on the second end of the base. The circuit further includes a microstrip transmission line having a first end and a second end and means for coupling RF signals between the first port of the radio frequency circuit and the first end of the microstrip transmission line. The circuit further includes a first substrate disposed on the first surface of the base and having an amplifier circuit disposed on a first surface of the first substrate with the amplifier having an input port and an output port with the input port coupled to the second end of the microstrip transmission line. A second substrate is disposed on the first surface of the base having a mixer circuit disposed on a first surface of the second substrate with the mixer circuit having a first port coupled to the output port of the amplifier circuit, a second port coupled to a first one of the pair of coaxial connectors and a third port coupled to a second one of the pair of coaxial connectors. With such an arrangement, an RF receiver having a waveguide port and a pair of coaxial connector ports is provided. The first port of the radio frequency circuit is directly coupled to a waveguide port of an antenna, for example, to provide a compact radio frequency receiver circuit. By coupling the waveguide port of the antenna directly to the waveguide port of the radio frequency circuit, an RF signal is thus coupled from the antenna to the RF circuit with a minimum insertion loss characteristic. If the means for coupling RF signals between the waveguide port and the microstrip transmission line is provided as a waveguide transition circuit having an RF bead and a dielectric slab, the circuit is provided as a compact, hermetically sealed circuit. If the amplifier circuit is provided as a low noise amplifier then the circuit is provided as a low noise receiver having a low noise figure for use in a radar system for example.

BRIEF DESCRIPTION OF DRAWINGS

The foregoing features of the invention, as well as the invention itself, may be more fully understood from the following detailed description of the drawings, in which:

FIGS. 2-2C are a series of views of an RF circuit including a waveguide transition circuit provided as an integral portion thereof;

FIGS. 3-3B are a series of cross-sectional views of the RF circuit shown in FIGS. 2-2C.

DESCRIPTION OF THE PREFERRED EMBODIMENTS

Figure 1:
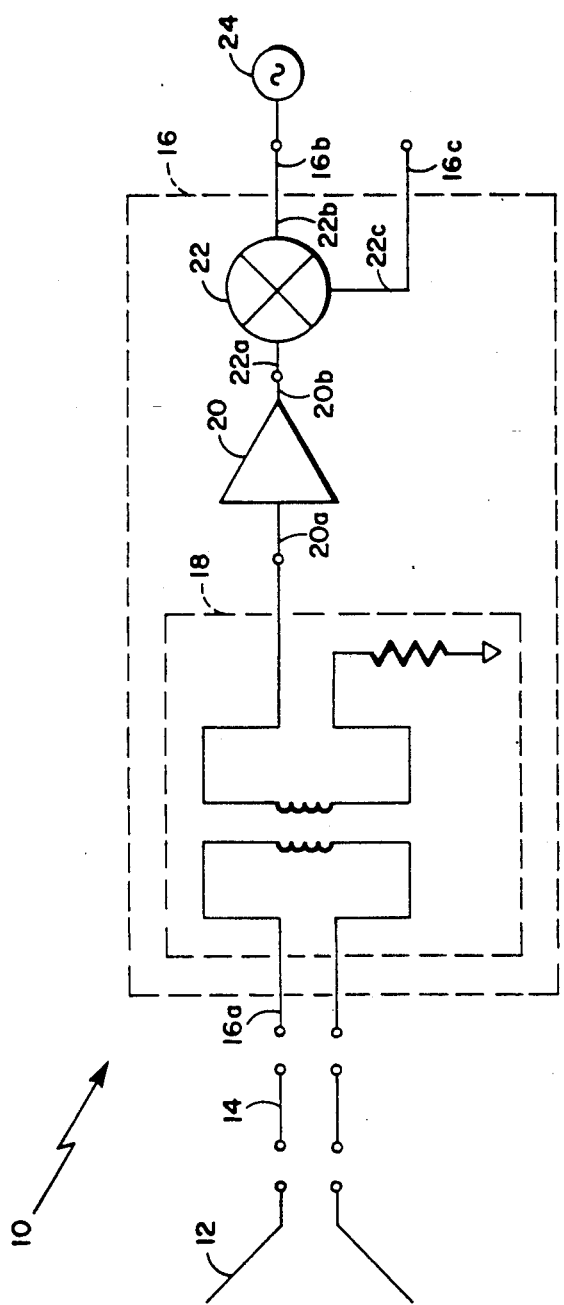
FIG. 1 is a schematic diagram of an RF receiving system.

Referring now to FIG. 1, a radio frequency (RF) receiving system 10 includes an antenna 12 coupled to a first end of an RF transmission line 14 which may be, for example, provided as a waveguide transmission line. A second end of the RF transmission line 14 is coupled to an input port 16a of an RF receiver 16. A transition circuit 18 couples the input port 16a of the receiver 16 to an input port 20a of a low noise amplifier (LNA) 20. The LNA 20 receives RF signals fed thereto and provides RF signals having amplified power levels at an output port 20b as is generally known. A mixer 22 has a first port 22a coupled to the output port 20b of the LNA 20. A second port 22b of the mixer 22 is coupled to a second port 16b of the receiver 16. A signal source 24 provides a local oscillator (LO) signal to the mixer 22 via the receiver port 16b. The mixer 22 receives the LO signal at the port 22b. The mixer 22 provides an intermediate frequency (IF) signal at a third port 22c of the mixer 22 as is generally known. The IF signal is coupled from the mixer port 22c to a third port 16c of the receiver 16.

Referring now to FIGS. 2, 2A and 2B where like elements of the receiver 16 of FIG. 1 are referenced with the same designations, the receiver 16 is disposed in a hermetically sealed housing 26, said housing having a cover portion 56, sidewall portions 26a, 26b (FIG. 2), endwall portions 26c (FIG. 2A), 26d (FIG. 2B) and a base portion 26e (FIG. 2A, 2B), all comprised of an electrically conductive material. The endwall 26c is provided having a rectangular void and a cylindrical void. The rectangular void, having a width $W_1$ (FIG. 3A), a height $H_1$ (FIGS. 3, 3A) and a length L1 (FIG. 3), provides a waveguide transmission line 28 as will be further described in conjunction with FIGS. 3, 3A. A first end of the rectangular waveguide transmission line 28 provides the input port 16a (FIG. 2A) of the receiver 16 as a waveguide input port. A pair of alignment pins, 34a, 34b (FIGS. 2, 2A) are disposed in the endwall 26c. The alignment pins 34a, 34b are provided to align the waveguide port 16a to a corresponding waveguide port of a waveguide transmission line (not shown) for example. A pair of coaxial connector ports 16b, 16c are disposed on the endwall portion 26d (FIG. 2B) of the housing 26 as shown.

The waveguide transition circuit 18 is disposed between a second end of the waveguide transmission line 28 and a microstrip transmission line 46. The waveguide transition circuit 18, as will be further described in conjunction with FIGS. 3, 3A and 3B, here includes the waveguide transmission line 28 and the waveguide port 16a. The waveguide transition circuit 18 is thus provided as an integral portion of the housing 26.

Alternatively, the waveguide transition circuit 18 may be provided as a separate circuit and attached to the base portion 26e (FIG. 3) of the housing 26 to provide both a physical transition and an electrical impedance transition between the waveguide port 16a and the microstrip transmission line 46.

The waveguide transition circuit 18 couples dominant mode electromagnetic waves from the waveguide port 16a to the input port 20a of the low noise amplifier 20 via the microstrip transmission line 46.

Figure 2C:
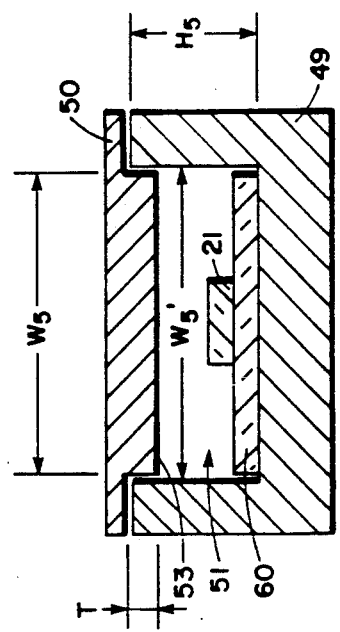

Referring momentarily to FIG. 2C, the LNA 20 is shown to include an electrically conductive base 49 having a groove 51 disposed therein, said groove 51 having a width $W_5'$ typically of about 0.143 inches and a height $H_5$ typically of about 0.072 inches. The height $H_5$ is selected to minimize radiation of stray electromagnetic energy in the LNA 20 and also to allow a substrate 60 and a transistor 21 to be disposed in the groove 51 using any of the commonly used tools generally referred to as bonding tools and well known to those of skill in the art. The substrate 60 and the transistor 21 will be further described in conjunction with FIG. 3.

A cover 50 having a rectangular member 53 disposed thereon is disposed over the conductive base 49 with the conductive member 53 disposed in the groove 51. The rectangular member 53 is provided having a width W5 typically of about 0.125 inches and a thickness T typically of about 0.02 inches. The rectangular member 53 prevents radiation of electromagnetic energy provided from discontinuities such as bends and junctions in the microstrip transmission lines disposed to provide the LNA 20. Such bends and junctions are often necessary to provide a compact circuit.

A thin layer of radar absorber material (RAM) such as an RF absorbing paint (not shown) for example may be disposed on the rectangular member 53 to attenuate stray electromagnetic signals incident thereon. Such materials are well known to those of skill in the art and here a material should be selected which provides RF absorbing properties at the frequency of operation of the LNA 20.

Referring again to FIG. 2, the LNA 20 receives RF signals fed thereto and provides RF signals having amplified power levels to a first port 22a of a mixer 22. A local oscillator (LO) signal is provided to the coaxial connector port 16b and is subsequently fed to the second mixer port 22b via a microstrip transmission line T22b. The mixer 22 provides an intermediate frequency (IF) signal at a third mixer port 22c. The IF signal is coupled from the mixer port 22c to the coaxial connector port 16c via a microstrip transmission line T22c.

Figure 3:
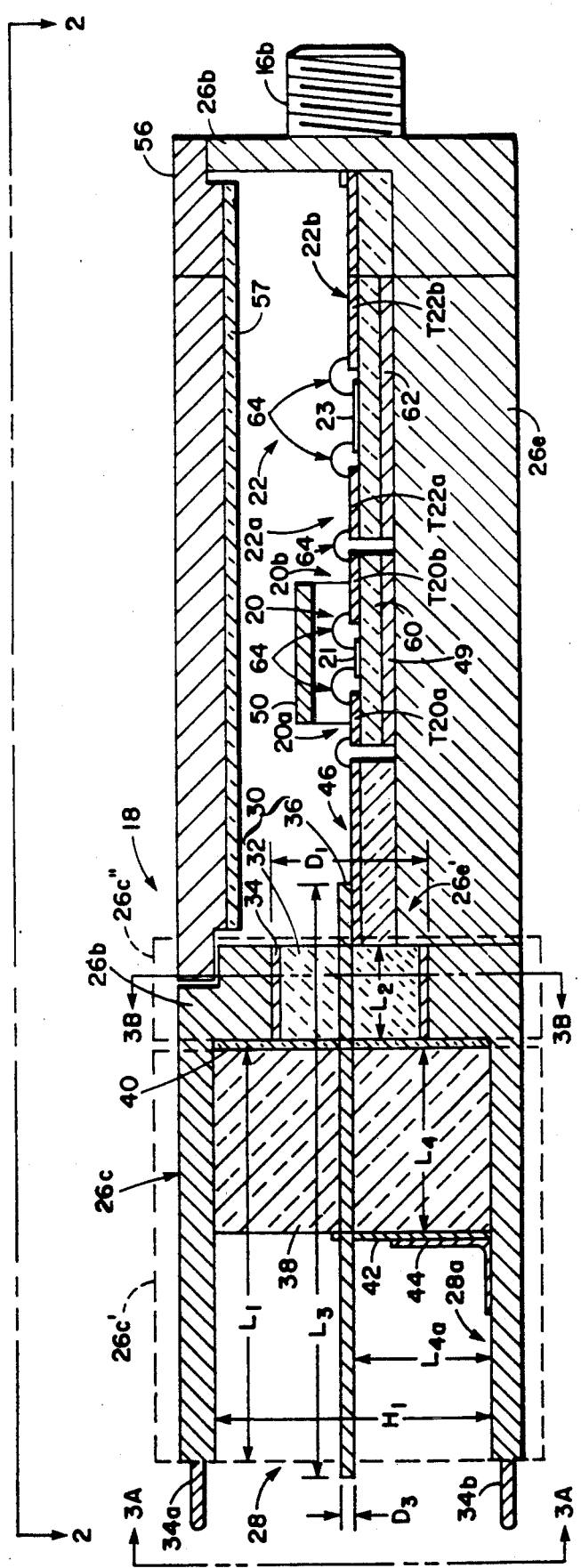

A first DC bias terminal 54a, provides a DC path between the LNA 20, the mixer 22, and the base 26e(-FIG. 3). A second DC bias terminal 54b couples DC voltages fed thereto to the LNA 20 to bias the LNA 20 as is generally known.

The housing cover 56 provides a physical and electrical shield to protect and electrically isolate from extraneous RF signals the RF circuitry such as the LNA 20, the mixer 22 and the microstrip transmission lines disposed on the first surface of the base 26e (FIG. 3). RF absorber material 57 (FIG. 3) having a thickness typically of about 0.020 inches is disposed on an inside surface of the cover 56. The RF absorber may be provided, for example, of the type manufactured by Cummings Corporation and identified as CRAM 369. The RF absorber material 57 attenuates stray electromagnetic signals which propagate inside the sealed housing 26 and which would otherwise reflect off the internal surface of the electrically conductive cover 56.

Laser welding techniques or any other technique well known to those of skill in the art may be used to secure the cover 56 to sidewall portions 26a, 26b and endwall portions 26c, 26d of the housing 26.

Referring now to FIGS. 3, 3A and 3B in which like elements of the receiver 16 are referenced with the same designations of FIGS. 2–2C, the transition circuit 18 is shown to particularly include the endwall portion 26c of the conductive housing 26. A first portion 26c' of the endwall 26c having the rectangular void therein provides the rectangular waveguide 28 having an internal width $W_1$ (FIG. 3A) typically of about 0.280 inches, an internal height $H_1$ (FIG. 3A) typically of about 0.140 inches, and a length $L_1$ typically of about 0.5 inches. A second portion 26c'' of the endwall 26c has a cylindrical void having a diameter $D_1$ (FIG. 3) typically of about 0.103 inches and a length $L_2$ typically of about 0.040 inches.

Here the endwall 26c and thus the rectangular and cylindrical voids are provided as an integral portion of the housing 26. Those of skill in the art, however, will recognize that the endwall 26c and the housing 26 may be provided as separate pieces. Similarly those of skill in the art will recognize that the sidewalls 26a, 26b, endwall 26d and the base 26e may all be provided as separate pieces. Such pieces would be assembled using techniques well known to those of skill in the art to provide a structure similar to the housing 26 here shown to include the sidewalls 26a, 26b; the transmission line 28 and the base 26e.

The waveguide transition circuit 18 further includes a so-called RF bead 30 which may be for example of the type manufactured by Metal Processing Company as part number MP-321. The RF bead 30 includes a first dielectric member 32 here provided as a cylinder of glass, having a length $L_2$ typically of about 0.040 inches and a base diameter $D_1'$ (FIG. 3B) typically of about 0.100 inches. An annular ring of conductive material 34, (FIG. 3B) is disposed on a circumferential surface of the first dielectric member 32.

The RF bead 30 further includes a conductive pin 36 having a length $L_3$ typically of about 0.432 inches and a diameter $D_3$ in the range of 0.010 to 0.025 inches. The glass cylinder 32 is disposed about a portion of the conductive pin 36.

The RF bead 30 is disposed in the cylindrical void of the endwall 26c. A first surface of the dielectric member 32 is disposed in contact with a shoulder 26e', provided by the base portion 26e. The RF bead 30 is secured to the endwall 26c by providing a solder connection between the conductive ring 34 and a circumferential surface of the cylindrical void. Such a solder connection provides a hermetic seal between the endwall 26c and the RF bead 30. The solder connection should be provided with a solder having a higher melting point than any other solder used to provide the receiver 16. This is to prevent "solder reflow" from occurring in this particular solder connection when other solder connections are provided in the assembly process of the receiver 16. Thus the RF bead provides a hermetic seal to one end of the waveguide transmission line 28.

A first end of the pin 36 is disposed in the rectangular waveguide transmission line 28. A second end of the pin 36 is disposed through the cylindrical void in the endwall 26c.

A second dielectric member 38 having an aperture, here provided as a circular hole, is disposed in the waveguide transmission line 28 about a second portion of the pin 36. The second dielectric member 38 is here provided as a rectangular slab having a length $L_4$ typically of about 0.038 inches, a width $W_1'$ (FIG. 3A) typically about 0.276 inches and a height $H_1'$ (FIG. 3A) typically about 0.136 inches. The width $W_1'$ (FIG. 3A) and height $H_1'$ (FIG. 3A) of the dielectric member 38 are here selected to substantially correspond to the internal width $W_1$ (FIG. 3A) and height $H_1$ (FIG. 3A) of the waveguide transmission line 28. The dielectric member 38 may of course be provided having any width $W_1'$ and height $H_1'$ allowing the member 38 to be disposed in the waveguide transmission line 28. The dielectric member 38 (FIGS. 3, 3A), which may be provided for example as of the type manufactured by Rogers Corporation and identified as RT/Duroid 5880 having a relative dielectric constant typically of about 2.2, provides structural support for that portion of the pin 36 disposed in the waveguide transmission line 28. The dielectric member 38 further provides a means for increasing the electrical pathlength $L_1$. Thus, the physical pathlength of the transmission line 28 may be compact for a pre-selected electrical pathlength.

A non-conductive epoxy 40, here having a preformed rectangular shape, contacts a first surface (not numbered) of the glass cylinder 32 and a first surface (not numbered) of the dielectric member 38. Thus the dielectric member 38 is secured to the glass cylinder 32 via the non-conductive epoxy 40.

A strip conductor 42 (FIGS. 3, 3A) having a length $L_1$ typically of about 0.070 inches and a width $W_4$ typically of about 0.060 inches is disposed on a second surface of the dielectric member 38 using any technique well known to those of skill in the art. The strip conductor 42 is provided having an aperture through which the pin 36 is disposed. An electrical connection is provided between the pin 36 and the strip conductor 42.

A first end of a conductive strap 44 which may be provided for example as a conductive ribbon having a width typically of about 0.005 inches is soldered to a first inner surface 28a of the rectangular waveguide 28. A thin layer of gold may be disposed on the surface 28a to facilitate the making of the solder connection. A second end of the conductive strap 44 is soldered to the strip conductor 42. Thus, the conductive strap 44 couples the strip conductor 42 to the inner surface 28a of the waveguide 28.

The conductive pin 36, the strip conductor 42 and the conductive strap 42 provide an electrically conductive loop. The loop couples the dominant mode transverse electric field propagating in the waveguide 28 to the microstrip transmission line 46. The length $L_3$ of the pin 36 may of course be varied to provide a minimum insertion loss characteristic and a minimum voltage standing wave ratio (VSWR) over a selected portion of a band of frequencies which may propagate in the particular waveguide transmission line 28 used in the transition circuit 18. Similarly, the width $W_1'$, length $L_4$ and height $H_1'$ of the dielectric member 38 may be selected to provide the transition circuit 18 having optimum electrical characteristics over a desired range of frequencies.

The waveguide transition circuit 18 couples dominant mode electromagnetic waves from the waveguide port 16a to a first end of the microstrip transmission line 46. A second end of the microstrip transmission line 46 is coupled to the input port 20a of the LNA 20.

The LNA 20 has a substrate portion 60 having a ground plane conductor disposed on a first surface thereof said first surface being secured to the base 26 using any technique well known to those of skill in the art. Strip conductors are disposed on a second surface of the substrate 60 to provide in combination with the substrate 60 and the ground plane conductor the LNA 20 having the input port 20a and the output port 20b as microstrip transmission lines.

The LNA 20 includes three transistor stages (not shown) each transistor stage having a Lange coupler on the input and output side. A microwave field effect transistor, here a metal semiconductor field effect transistor (MESFET) 21, is disposed on the substrate 60 and coupled to the microstrip transmission lines 20a, 20b via a plurality of bond wires generally denoted as 64. The MESFET 21 is here responsive to signals in the Ka band frequency range and may be for example of the type manufactured by Avantek Corporation. The LNA 20 receives signals fed to the input port 20a and provides amplified signals at the output port 20b. Bond wires 64 couple the output port 20b of the LNA 20 to the port 22a of the mixer circuit 22.

Selective ones of said input and output bond wires are removed to provide a requisite impedance matching condition between the input and output terminals (not numbered) of the MESFET 21 and the input and output propagation networks coupled to said terminals (not numbered).

The mixer circuit 22 is provided from a substrate 62 having a first surface secured to the base 26e. A plurality of diodes provided as a monolithic microwave integrated circuit 23 and a plurality of strip conductors T22a, T22b (FIG. 2) and T22c are disposed on a second surface of the substrate 62 to provide the mixer circuit 22 having the ports 22a, 22b (FIG. 2) and 22c.

Figure 4:
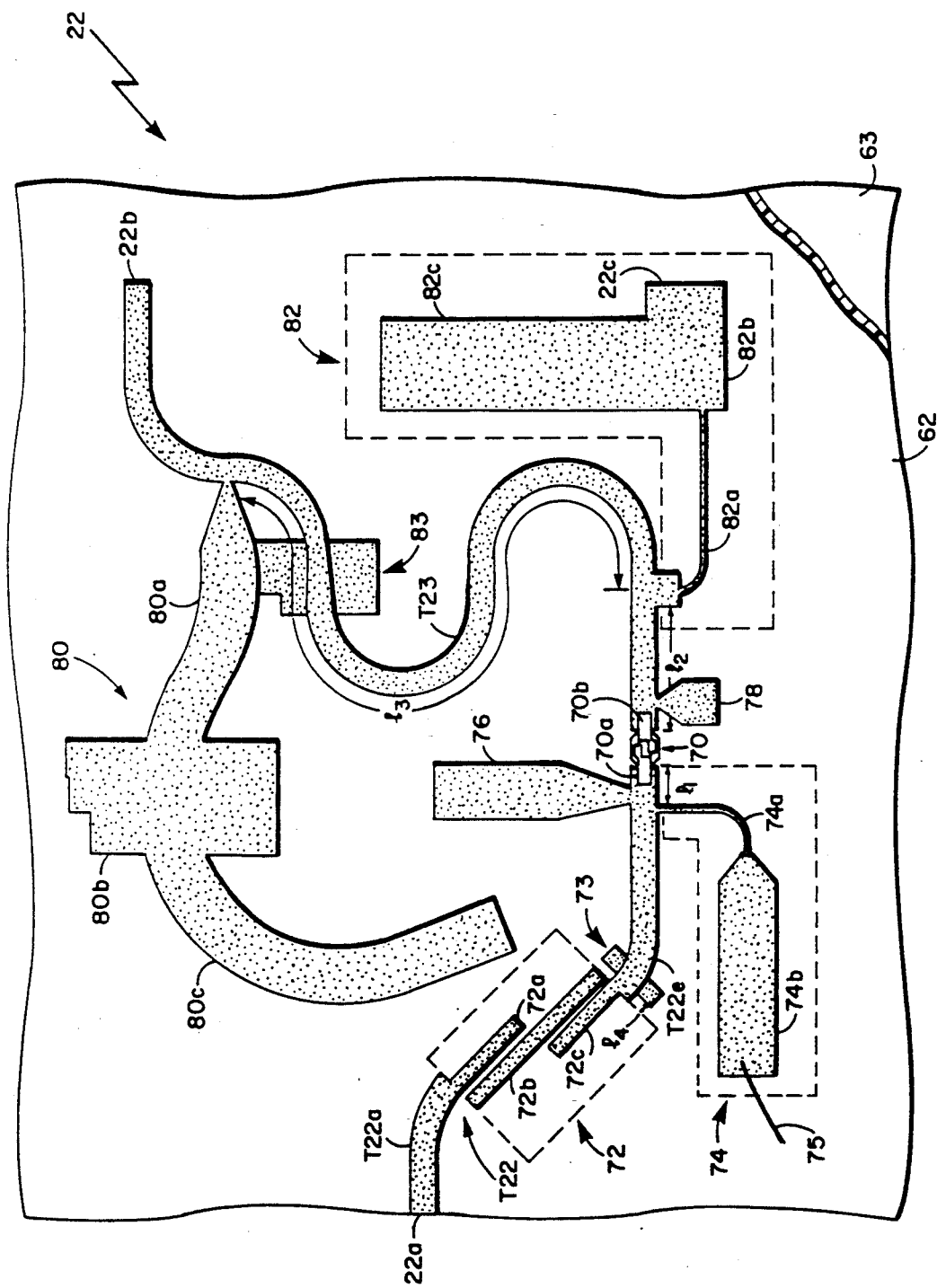
FIG. 4 is a plan view of an RF mixer circuit of the type used in the RF circuit of FIGS. 2 and 3.

Referring momentarily to FIG. 4, an embodiment of the RF mixer circuit 22 is shown fabricated as a hybrid microwave/millimeter wave integrated circuit (HMIMIC) mixer 22 having terminals 22a, 22b and 22c. The RF mixer 22 is disposed on the substrate 62, here comprised of 0.010 inch alumina or other suitable microwave substrate material. The substrate 62 has disposed on a bottom surface thereof, a ground plane conductor 63. The substrate 62 has disposed over a top surface thereof a plurality of strip conductors and an anti-parallel diode pair 70 having a first electrode 70a and a second electrode 70b and here provided as the monolithic microwave integrated circuit 23 (FIG. 3).

The strip conductors in combination with the substrate 62 and ground plane 63 provide microstrip transmission line sections T22a, T22e, T23, 74b, 82a and 82b. Transmission line sections T22a, 82b, and T23 provide 50 ohm characteristic impedances respectively to RF, IF and LO frequency signals propagating thereto. The strip conductors also provide microstrip transmission line resonators 72b, 76, 78 and 80. In general, the smooth corners and bends of the plurality of strip conductors provide continuous impedance characteristics to RF frequency signals propagating thereto.

Band pass filter 72, having 50 ohm input and output characteristic impedances, is comprised of coupled transmission lines here microstrip transmission line resonators 72a, 72b and 72c. Transmission line resonators 72a and 72c each have an electrical pathlength corresponding to one quarter wavelength at the RF frequency and transmission line resonator 72b has an electrical pathlength corresponding to one half wavelength at the RF frequency. The width of conductors 72a, 72b and 72c as well as the gaps (not numbered) between said conductors are chosen to provide a minimum insertion loss characteristic and an optimum impedance characteristic over the pass band of the filter 72. A first end of filter 72 is provided as an integral portion of RF propagation network T22a and the second end of filter 72 is provided as an integral portion of microstrip transmission line T22b.

An optional matching network 73 is disposed along microstrip transmission line T22b at a distance $l_4$ from a first end of transmission line T22b to improve the impedance match between the filter 72 and the microstrip transmission line T22b. Distance $l_4$ is selected either empirically or analytically to provide an optimum impedance match between filter 72 and microstrip transmission line T22b. A second end of transmission line T22b is connected to terminal 70a of anti-parallel diode pair 70.

Anti-parallel diode pair 70 is comprised of Schottky barrier diodes provided as a monolithic circuit comprised of GaAs and connected as an anti-parallel diode pair. Anti-parallel diode pair 70 is coupled to microstrip transmission lines T22b, T23 using any technique well known to those of skill in the art.

Network 74, coupled to transmission line T22b a distance $l_1$ from anti-parallel diode pair terminal 70a for providing a DC path to ground, is comprised of microstrip transmission line sections 74a and 74b. The width of microstrip transmission line 74a is selected to provide a relatively high characteristic impedance to RF frequency signals and thus remain relatively transparent to RF signals propagating along RF propagation network T22b. A second end of microstrip transmission line 74a is coupled to a first end of microstrip transmission line 74b. A DC return path to ground may be provided from a second end of microstrip transmission line 74b using either bond wires, bond ribbon or via hole technology as is known to those of skill in the art. Here, a bond wire 75 is shown connected to transmission line 74b, however the connection to ground is not shown.

Microstrip transmission line resonators 76, 78, 80, each having tapered first ends, are coupled to the RF propagation networks T22e and T23 as shown. A tapered first end coupled to an RF propagation network provides less coupling between the transmission line resonator and the RF propagation and also provides a more precise point of contact to the RF propagation network. Thus, the transmission line resonator provides an impedance value which closely corresponds to the pre-selected impedance value. Therefore, a tapered first end improves the electrical performance of the mixer circuit 22.

A network 82 is coupled between microstrip transmission line T23 and mixer terminal 22c a distance $l_2$ from diode pair terminal 70b. Network 82 is comprised of microstrip transmission line sections 82a, 82b and a microstrip transmission line resonator 82c. Network 82 provides a high impedance characteristic to LO frequency signals propagating along transmission line T23 and a matched impedance characteristic to IF frequency signals propagating along transmission line T23. The width of microstrip transmission line 82a is selected to provide transmission line 82a a high characteristic impedance to LO frequency signals propagating thereto while providing a matched impedance to IF frequency signals propagating thereto.

Thus, a signal path between transmission line T23 and network 82 is provided to IF frequency signals while at the same time coupling of LO frequency signals between transmission line T23 and network 82 is minimized.

A fourth microstrip transmission line resonator 80, having an electrical pathlength corresponding to one quarter wavelength at the IF frequency, is disposed along microstrip transmission line T23 at a distance $l_3$ from the point where network 82 is coupled to RF propagation network T23. When distance $l_3$ is selected to have an electrical pathlength corresponding to one quarter wavelength at the IF frequency, microstrip transmission line resonator 80, comprised of microstrip transmission line sections 80a, 80b and 80c, provides a high impedance characteristic to IF frequency signals propagating along microstrip transmission line T23 at the point where network 82 is coupled to RF propagation network T23. The distance $l_3$ may be determined analytically or empirically. Thus, the high impedance provided by the appropriately spaced network 80 causes IF frequency signals to propagate through network 82 to mixer terminal 22c.

An optional matching network 83 may be disposed between transmission lines T23 and 80a. It is believed that network 83 aids in providing a high impedance at the point where network 80 is coupled to transmission line T23 to LO frequency signals fed into terminal 22b, thereby preventing LO frequency signals from propagating through network 80.

As is generally known, optional matching networks (not shown) may be disposed along any or all of the plurality of strip conductors as required to compensate for impedance variations which occur in such hybrid microwave/millimeter wave integrated circuits. Such optional matching networks provide impedance matching flexibility required to compensate for undesired signal reflections which occur in such RF mixer circuits. Such reflections are caused by variations in diode impedances, coupling between strip conductors, variations in substrate dielectric constant as well as other causes of impedance variations as are generally known to one of skill in the art.

Referring again to FIG. 3, the mixer circuit 22 receives RF signals fed to the mixer port 22a from the output port 20b of the LNA 20. A local oscillator signal fed to the coaxial connector port 16b is coupled to the mixer port 22b via a microstrip transmission line T22b. The mixer provides an intermediate frequency (IF) signal at the port 22c. Referring also to FIG. 2, the IF signal is coupled from the mixer port 22c to the coaxial connector port 16c via a microstrip transmission line T22c.

By providing the transition circuit 18 as an integral portion of the housing 26, the RF receiver 16 is provided as a compact circuit. Further the transition circuit 18, having a low insertion loss characteristic, in combination with the low noise amplifier 20 provides the receiver 16 having a low noise figure. Moreover the RF bead 30, and the pair of coaxial connectors 16b, 16c each provide the RF receiver 16 having hermetically sealed ports. The RF receiver 16 is thus provided as a compact, hermetically sealed RF receiver having a low noise figure.

Having described the preferred embodiments of the invention, it will now become apparent to one of skill in the art that other embodiments incorporating their concepts may be used. It is felt, therefore, that these embodiments should not be limited to the disclosed embodiments, but rather should be limited only by the spirit and scope of the appended claims.

What is claimed is:

1. A transition circuit comprising:
   a section of waveguide transmission line having an inner cavity with a conductive wall, the section of waveguide further having an end wall with a cylindrical void;
   a conductive pin;
   a first dielectric member disposed about a first portion of said conductive pin and extending within the cylindrical void of the end wall;
   a second dielectric member disposed within the inner cavity and disposed about a second, different portion of said conductive pin and having a first surface disposed adjacent to a first surface of said first dielectric member;
   and
   a strip conductor disposed on a second surface of said second dielectric member and coupled between said conductive pin and said conductive wall.

2. The circuit of claim 1 wherein said first dielectric member comprises a glass cylinder.

3. The circuit of claim 2 wherein said waveguide transmission line is a rectangular waveguide transmission line.

4. The circuit of claim 2 wherein said waveguide transmission line is a circular waveguide transmission line.

5. A radio frequency circuit comprising:
   a waveguide transmission line having a first port and a second port;
   a conductive wall disposed across the second port of the waveguide and having an aperture therethrough;
   a conductive pin having a first end and a second end;
   a first dielectric member disposed about a first portion of said conductive pin and disposed in the aperture of said conductive wall;
   a second dielectric member disposed about a second, different portion of said conductive pin and having a first surface disposed adjacent to a first surface of said first dielectric member; and
   a strip conductor disposed on a second surface of said second dielectric member and electrically coupled between said conductive pin and said waveguide transmission line.

6. The radio frequency circuit of claim 5 wherein said second dielectric member comprises a shape substantially the same cross-sectional shape as the waveguide transmission line.

7. The radio frequency circuit of claim 6 wherein said waveguide has a rectangular cross-sectional shape.

8. The radio frequency circuit of claim 6 wherein said waveguide has a circular cross-sectional shape.

9. The radio frequency circuit of claim 6 wherein said first end of said conductive pin is coupled to a microstrip transmission line.

10. A transducer for coupling radio frequency energy comprising:
    a section of waveguide having an inner cavity with a wall surface, the section of waveguide further having an end wall with a cylindrical void;
    a conductive pin having a first portion longitudinally disposed within the inner cavity of the section of waveguide and a second portion extending through the cylindrical void of the end wall;

a first dielectric member extending within the cylindrical void of the end wall about a first portion of the conductive pin;

a second dielectric member disposed within the inner cavity of the section of waveguide about a second portion of the conductive pin and disposed adjacent to the first dielectric member;

a strip conductor disposed adjacent the second dielectric member and electrically connecting the conductive pin to the wall surface of the inner cavity of the section of waveguide.

11. A transducer for coupling radio frequency energy as recited in claim 10 further comprising means for coupling radio frequency energy from the conductive pin to stripline circuitry.

* * * * *